United States Patent
Ou et al.

(10) Patent No.: US 12,453,119 B2
(45) Date of Patent: Oct. 21, 2025

(54) GALLIUM OXIDE SEMICONDUCTOR STRUCTURE, VERTICAL GALLIUM OXIDE-BASED POWER DEVICE, AND PREPARATION METHOD

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Xin Ou, Shanghai (CN); Wenhui Xu, Shanghai (CN); Tiangui You, Shanghai (CN); Zhenghao Shen, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 660 days.

(21) Appl. No.: 17/779,573

(22) PCT Filed: Nov. 3, 2020

(86) PCT No.: PCT/CN2020/126024
§ 371 (c)(1),
(2) Date: May 25, 2022

(87) PCT Pub. No.: WO2021/103953
PCT Pub. Date: Jun. 3, 2021

(65) Prior Publication Data
US 2023/0127051 A1    Apr. 27, 2023

(30) Foreign Application Priority Data
Nov. 26, 2019 (CN) .......................... 201911174463.9

(51) Int. Cl.
*H01L 29/78* (2006.01)
*H01L 21/02* (2006.01)
(Continued)

(52) U.S. Cl.
CPC ....... *H10D 30/63* (2025.01); *H01L 21/02002* (2013.01); *H10D 30/611* (2025.01);
(Continued)

(58) Field of Classification Search
CPC .... H10D 30/63; H10D 30/611; H10D 62/105; H10D 62/82; H10D 62/8325;
(Continued)

(56) References Cited

U.S. PATENT DOCUMENTS

| 2018/0254355 A1* | 9/2018 | Sasaki | H01L 21/02576 |
| 2019/0233280 A1* | 8/2019 | Li | B81B 1/004 |
| 2020/0168460 A1* | 5/2020 | Kuramata | H01L 21/02667 |

FOREIGN PATENT DOCUMENTS

| CN | 106449419 Y | 2/2017 |
| CN | 208062057 A | 11/2018 |

(Continued)

*Primary Examiner* — Cuong B Nguyen
(74) *Attorney, Agent, or Firm* — IPRTOP LLC

(57) ABSTRACT

The present disclosure provides a gallium oxide semiconductor structure, a vertical gallium oxide-based power device, and a preparation method. An unintentionally doped gallium oxide layer (110) is transferred to a highly doped and highly thermally conductive heterogeneous substrate (200) by bonding and thinning; then a heavily doped gallium oxide layer (120) is formed on the gallium oxide layer by treating and ion implantation, thereby preparing the gallium oxide semiconductor structure including the heterogeneous substrate (200), the gallium oxide layer (110), and the heavily doped gallium oxide layer (120) stacked in sequence. In the vertical gallium oxide-based power device prepared on the basis of the gallium oxide semiconductor
(Continued)

structure, the gallium oxide layer (110) is a thicker intermediate layer and a carrier concentration of the gallium oxide layer (110) is less than that of the heavily doped gallium oxide layer (120). Therefore, the breakdown voltage of the device is also increased through structural design. The highly thermally conductive heterogeneous substrate (200) improves the heat dissipation performance of the device. The device with multiple Fin structures provides a large amount of current.

14 Claims, 4 Drawing Sheets

(51) Int. Cl.
*H10D 30/60* (2025.01)
*H10D 30/63* (2025.01)
*H10D 62/10* (2025.01)
*H10D 62/82* (2025.01)
*H10D 62/832* (2025.01)

(52) U.S. Cl.
CPC .......... *H10D 62/105* (2025.01); *H10D 62/82* (2025.01); *H10D 62/8325* (2025.01)

(58) Field of Classification Search
CPC .... H10D 30/025; H10D 30/635; H10D 62/80; H10D 64/513; H10D 99/00; H01L 21/02002; H01L 21/465; H01L 21/467; H01L 21/187; H01L 2224/83894–83896; H01L 21/0415; H01L 21/2253
See application file for complete search history.

(56) References Cited

FOREIGN PATENT DOCUMENTS

| | | |
|---|---|---|
| CN | 109671612 A | 4/2019 |
| CN | 111223782 | 6/2020 |
| WO | 2019013170 Y | 1/2019 |

\* cited by examiner

GALLIUM OXIDE SEMICONDUCTOR STRUCTURE, VERTICAL GALLIUM OXIDE-BASED POWER DEVICE, AND PREPARATION METHOD

CROSS REFERENCE TO RELATED APPLICATION

This is a Sect. 371 National Stage application of a PCT International Application No. PCT/CN2020/126024, filed on Nov. 3, 2020, which claims priority to Chinese Patent Application No. 2019111744639, filed with the China National Intellectual Property Administration on Nov. 26, 2019 and entitled "GALLIUM OXIDE SEMICONDUCTOR STRUCTURE, VERTICAL GALLIUM OXIDE-BASED POWER DEVICE, AND PREPARATION METHOD", which is incorporated herein by reference in its entirety.

TECHNICAL FIELD

The present disclosure relates to the field of semiconductor manufacturing, and in particular, a gallium oxide semiconductor structure, a vertical gallium oxide-based power device, and a preparation method.

BACKGROUND

Gallium oxide ($Ga_2O_3$) is an ultra-wide band gap semiconductor material. A band gap of gallium oxide is in a range of 4.5 eV to 4.9 eV. Compared with gallium nitride (GaN) and silicon carbide (SiC), gallium oxide has a larger band gap, and a higher breakdown field strength. In addition, as a preparation method of gallium oxide is very simple, gallium oxide has attracted great attention in ultra-high voltage power electronic devices.

Gallium oxide-based devices with a high-voltage and a high-power have a great prospect for application in civil and military fields, such as new energy electric vehicles, ultra-high voltage power transmission, high-speed railways, and electromagnetic railguns. Particularly, with the gradual development of military equipments, gallium oxide-based devices may replace silicon-based, silicon-carbide-based and gallium-nitride-based power devices, and become a core component of power modules in aerospace, naval ships, watercrafts, and special weapons. Gallium oxide-based devices provide a necessary guarantee for the normal operation of a system under high temperature, high frequency, high power and extremely harsh ambient conditions. Therefore, gallium oxide-based devices have a great application prospects in military and national defense construction. Meanwhile, gallium oxide-based devices are also applied to frequency converters, high-speed rail locomotives, inverters in new energy power generation systems, high-voltage direct-current (HVDC) power transmission systems, and other civil fields. It should be pointed out that as the aerospace equipment continuously becomes highly integrated, multi-functional, and low power consuming, there is an urgent need for miniaturized, high-performance, high-efficiency, and high-reliability electronic components to reduce the power consumption, improve the response speed of the system and reduce the noise. In fields of artificial satellites and space exploration, power devices will be affected by the space irradiation environment. In this case, gallium oxide-based power devices with a larger band gap and a better radiation resistance are undoubtedly an ideal choice.

The gallium oxide-based power devices include devices with lateral and vertical structures. For high-power devices, the vertical structure is more preferred by those skilled in the art. At present, a gallium oxide transistor is prepared by using a homo-epitaxial method. That is, a gallium oxide thin film is prepared by using an epitaxial method on a gallium oxide substrate, thereby preparing the gallium oxide transistor. The vertical structure can not only provide a high breakdown voltage, but also provide a super-large amount of current through the structure design. Therefore, gallium oxide has a promising prospect. However, a homogeneous gallium oxide substrate has poor thermal conductivity, so the heat flow generated in power devices cannot be well dissipated, which seriously deteriorates the performance of power devices.

To solve the problem of poor thermal conductivity, it is urgent to transfer gallium oxide to a highly doped, highly thermally conductive heterogeneous substrate in the process of preparing the vertical gallium oxide-based high-power device. However, due to the lattice mismatch between gallium oxide and highly doped, highly thermally conductive semiconductor materials, e.g., silicon, silicon carbide or the like, it is impossible to grow a high quality gallium oxide film by using the epitaxial method, causing difficulty in the preparation of the vertical gallium oxide-based high-power device.

Based on this, it is necessary to provide a novel gallium oxide semiconductor structure, a vertical gallium oxide-based power device, and a preparation method.

SUMMARY

In view of the above-mentioned shortcomings of the prior art, an object of the present disclosure is to provide a gallium oxide semiconductor structure, a vertical gallium oxide-based power device, and a preparation method, to solve the following problem that it is difficult to prepare a high-quality gallium oxide thin film on a highly doped, highly thermally conductive heterogeneous substrate during the preparation of a vertical gallium oxide-based high-power device.

To achieve the above object and other related objects, the present disclosure provides a method for preparing a gallium oxide semiconductor structure, which comprises the following steps:

providing a gallium oxide single crystal wafer, wherein a surface of the gallium oxide single crystal wafer is a polished surface; providing a heterogeneous substrate, wherein a surface of the heterogeneous substrate is a polished surface; bonding the polished surface of the gallium oxide single crystal wafer to the polished surface of the heterogeneous substrate; thinning the gallium oxide single crystal wafer to obtain a composite structure comprising the heterogeneous substrate and the gallium oxide layer stacked in sequence; treating a top surface of the gallium oxide layer, wherein the top surface of the gallium oxide layer is facing away from the polished surface of the heterogeneous substrate; and forming a heavily doped gallium oxide layer on the top surface of the gallium oxide layer by performing an ion implantation on the gallium oxide layer, thereby obtaining the gallium oxide semiconductor structure comprising the heterogeneous substrate, the gallium oxide layer, and the heavily doped gallium oxide layer stacked in sequence.

Optionally, the heterogeneous substrate comprises one of a silicon carbide substrate, a diamond substrate, an aluminum nitride substrate, and a silicon substrate.

Optionally, a carrier concentration of the heterogeneous substrate is greater than $1\times10^{18}/cm^3$.

Optionally, a carrier concentration of the gallium oxide layer is lower than that of the heavily doped gallium oxide layer, wherein the carrier concentration of the gallium oxide layer is in a range of $1\times10^{16}/cm^3$ to $9\times10^{17}/cm^3$, and the carrier concentration of the heavily doped gallium oxide layer is greater than $1\times10^{19}/cm^3$.

Optionally, a method for bonding the polished surface of the gallium oxide single crystal wafer to the polished surface of the heterogeneous substrate comprises surface-activated bonding, and the surface-activated bonding is performed at a vacuum level of $1\times10^{-7}$ Pa, under a stress of 16 MPa, at a temperature of 25° C.

Optionally, a method for thinning the gallium oxide single crystal wafer comprises grinding or wet etching.

Optionally, when the grinding is adopted to thin the gallium oxide single crystal wafer, the grinding is performed at a gear speed of 1500 rpm to 3000 rpm, a rotational speed of a workbench of 30 rpm to 120 rpm, a feed speed of 5 µm/min to 30 µm/min, and a grinding time of 30 s to 100 min.

Optionally, a method for treating a top surface of the gallium oxide layer comprises one of chemical mechanical polishing, plasma etching, ion sputtering and chemical etching.

Optionally, the ion implantation comprises one of Si ion implantation, Ge ion implantation, Sn ion implantation and Nb ion implantation.

Optionally, the Si ion implantation takes place at an energy level of 10 Kev to 80 Kev and at a dose of $1\times10^{15}$ ions/cm² to $5\times10^{16}$ ions/cm²; the Ge ion implantation takes place at an energy level of 20 Kev to 170 Kev and at a dose of $1\times10^{15}$ ions/cm² to $5\times10^{16}$ ions/cm²; the Sn ion implantation takes place at an energy level of 30 Kev to 275 Kev and at a dose of $1\times10^{15}$ ions/cm² to $5\times10^{16}$ ions/cm²; and the Nb ion implantation takes place at an energy level of 25 Kev to 225 Kev and at a dose of $1\times10^{15}$ ions/cm² to $5\times10^{16}$ ions/cm².

Optionally, the depth of the ion implantation is in a range of 10 nm to 60 nm.

Optionally, a surface roughness of the polished surface of the gallium oxide single crystal wafer is less than 1 nm, and a surface roughness of the polished surface of the heterogeneous substrate is less than 1 nm.

The present disclosure also provides a gallium oxide semiconductor structure, which comprises a heterogeneous substrate, a gallium oxide layer and a heavily doped gallium oxide layer stacked in sequence.

Optionally, a carrier concentration of the gallium oxide layer is lower than that of the heavily doped gallium oxide layer, wherein the carrier concentration of the gallium oxide layer is in a range of $1\times10^{16}/cm^3$ to $9\times10^{17}/cm^3$, and the carrier concentration of the heavily doped gallium oxide layer is greater than $1\times10^{19}/cm^3$.

Optionally, the thickness of the gallium oxide layer is in a range of 5 µm to 100 µm, and the thickness of the heavily doped gallium oxide layer is in a range of 10 nm to 60 nm.

Optionally, the heterogeneous substrate comprises one of a silicon carbide substrate, a diamond substrate, an aluminum nitride substrate, and a silicon substrate, and a carrier concentration of the heterogeneous substrate is greater than $1\times10^{18}/cm^3$.

The present disclosure also provides a method for preparing a vertical gallium oxide-based power device, which comprises preparing the vertical gallium oxide-based power device by using the method for preparing a gallium oxide semiconductor structure as described above.

The present disclosure also provides a vertical gallium oxide-based power device, which comprises a gallium oxide semiconductor structure as described above.

As described above, the present disclosure provides the gallium oxide semiconductor structure, the vertical gallium oxide-based power device and the preparation method. An unintentionally doped gallium oxide layer is transferred to a highly doped and highly thermally conductive heterogeneous substrate by bonding and thinning. Then a heavily doped gallium oxide layer is formed on the gallium oxide layer by treating and ion implantation, thereby preparing the gallium oxide semiconductor structure comprising the heterogeneous substrate, the gallium oxide layer, and the heavily doped gallium oxide layer stacked in sequence. Consequently, the present disclosure solves the problem of poor thermal conductivity of a gallium oxide thin film prepared by using a homo-epitaxial method, and the problem of difficulty in growing a high-quality gallium oxide thin film due to lattice mismatch when the gallium oxide thin film is prepared by using an epitaxial method on a heterogeneous substrate. In a vertical gallium oxide-based power device prepared on the basis of the gallium oxide semiconductor structure, the gallium oxide layer is a thicker intermediate layer and a carrier concentration of the gallium oxide layer is less than that of the heavily doped gallium oxide layer. In addition, the breakdown voltage of the device is also increased through structural design. The highly thermally conductive heterogeneous substrate improves the heat dissipation performance of the device. The device with multiple Fin structures provides a large amount of current. The present disclosure is of great significance for the development of vertical gallium oxide-based high-power devices in the future.

REFERENCE NUMERALS

Figure 1:
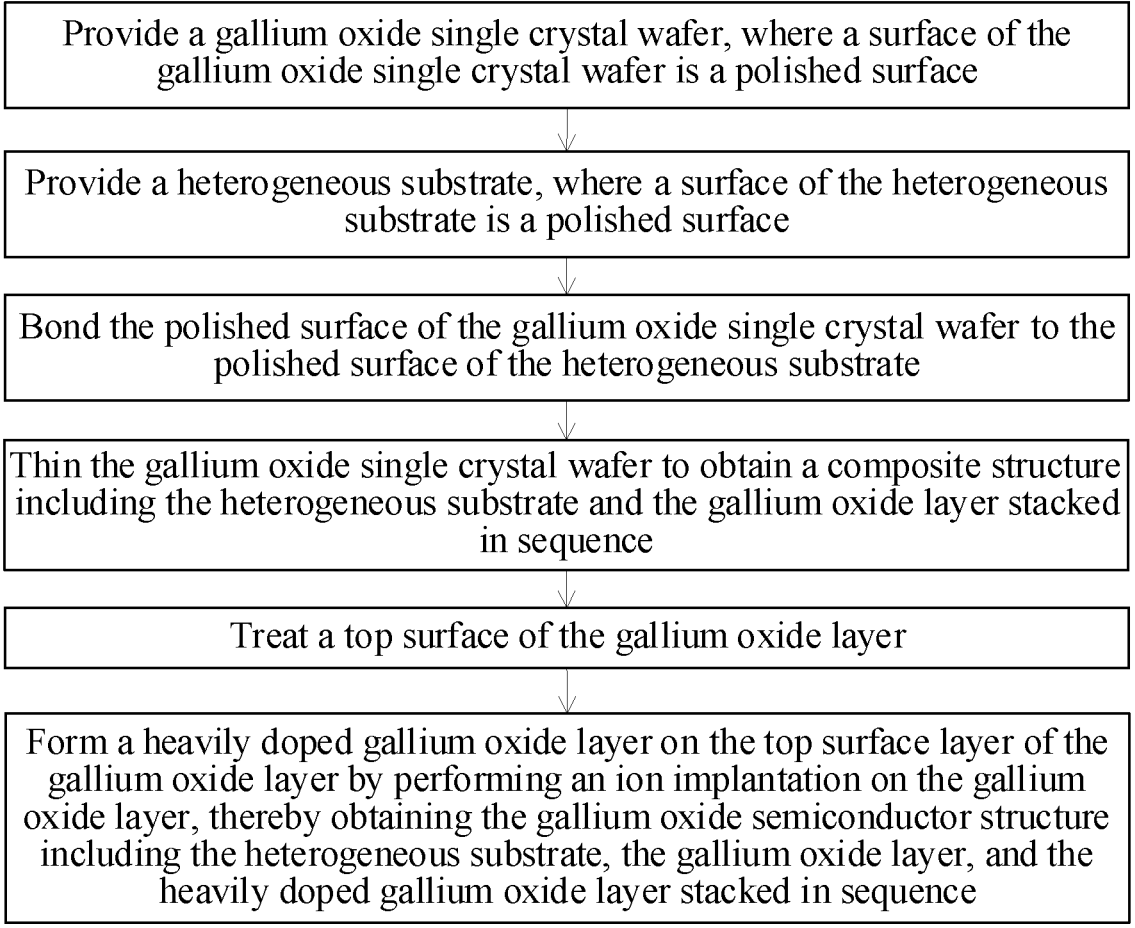
FIG. 1 is a flow chart of a method for preparing a gallium oxide semiconductor structure according to an embodiment of the present disclosure.

100 Gallium oxide single crystal wafer
100a Polished surface of gallium oxide single crystal wafer
200 Heterogeneous substrate
200a Polished surface of heterogeneous substrate
110 Gallium oxide layer
120 Heavily doped gallium oxide layer
300 Source electrode
400 Drain electrode
500 Gate oxide layer
600 Gate electrode
700 Gate contact

DETAILED DESCRIPTION OF THE PREFERRED EMBODIMENTS

The implementations of the present disclosure are described below by way of specific embodiments, and other advantages and effects of the present disclosure are readily comprehensible to those skilled in the art from the disclosure of the present disclosure. The present disclosure may be embodied or practiced in various other specific embodiments, the details in the specification may also be based on different perspectives and applications, and various modifications and changes may be made without departing from the spirit and scope of the present disclosure.

Referring to FIG. 1 to FIG. 9, it should be noted that drawings provided in this embodiment only exemplify the basic idea of the present disclosure. Therefore, only the components related to the present disclosure are shown in the drawings, and are not drawn according to the quantities, shapes, and sizes of the components during actual implementation. During actual implementation, the types, quantities, and proportions of the components may be randomly changed, and the layout pattern of the components may be more complicated.

As shown in FIG. 1, an embodiment of the present disclosure provides a method for preparing a gallium oxide semiconductor structure. In the embodiment, an unintentionally doped gallium oxide layer is transferred to a highly doped and highly thermally conductive heterogeneous substrate by bonding and thinning. Then a heavily doped gallium oxide layer is formed on the gallium oxide layer by treating and ion implantation, thereby preparing the gallium oxide semiconductor structure comprising the heterogeneous substrate, the gallium oxide layer, and the heavily doped gallium oxide layer stacked in sequence. Consequently, the present disclosure solves the problem of poor thermal conductivity of a gallium oxide thin film prepared by using a homo-epitaxial method, and the problem of difficulty in growing a high-quality gallium oxide thin film due to lattice mismatch when the gallium oxide thin film is prepared by using an epitaxial method on a heterogeneous substrate.

In an embodiment, FIGS. 2-6 are schematic structural diagrams of structures formed in each step of preparing the gallium oxide semiconductor structure.

Figure 2:
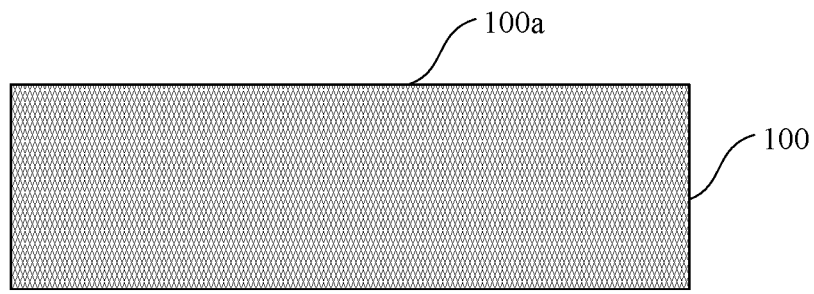
FIG. 2 is a schematic structural diagram of a gallium oxide single crystal wafer according to an embodiment of the present disclosure.

As shown in FIG. 2, a gallium oxide single crystal wafer 100 is provided, where a surface of the gallium oxide single crystal wafer 100 is a polished surface 100a of the gallium oxide single crystal wafer 100.

In an embodiment, the gallium oxide single crystal wafer 100 comprises an α-type gallium oxide single crystal wafer or a β-type gallium oxide single crystal wafer, and the size of the gallium oxide single crystal wafer 100 is in a range of 2 inches to 4 inches as required. A surface orientation of the single crystal plane of the gallium oxide single crystal wafer 100 comprises one of (−201), (010), and (001). The gallium oxide single crystal wafer is an unintentionally doped gallium oxide single crystal wafer, and a carrier concentration of the gallium oxide single crystal wafer is in a range of $1\times10^{16}/cm^3$ to $9\times10^{17}/cm^3$; and a surface roughness of the polished surface 100a of the gallium oxide single crystal wafer is less than 1 nm, such as 0.2 nm, 0.4 nm, or the like.

Figure 3:
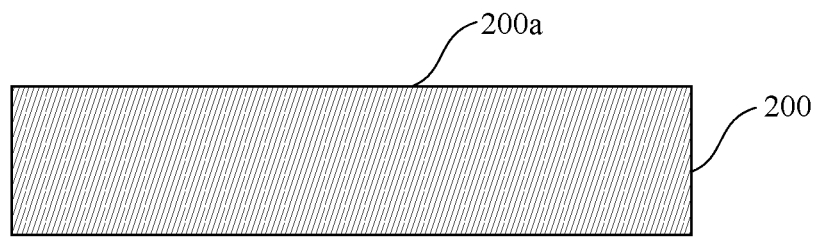
FIG. 3 is a schematic structural diagram of a heterogeneous substrate according to an embodiment of the present disclosure.

Next, as shown in FIG. 3, a heterogeneous substrate 200 is provided, where the surface of the heterogeneous substrate 200 is a polished surface 200a of the heterogeneous substrate.

In an embodiment, the heterogeneous substrate 200 is a highly doped, highly thermally conductive heterogeneous substrate, and the heterogeneous substrate 200 comprises one of a silicon carbide substrate, a diamond substrate, an aluminum nitride substrate, and a silicon substrate. A doping concentration of the heterogeneous substrate 200 is greater than $1\times10^{18}/cm^3$, and a surface roughness of the polished surface 200a of the heterogeneous substrate is less than 1 nm, such as 0.2 nm, 0.4 nm, or the like.

Figure 4:
FIG. 4 is a schematic structural diagram of a structure formed after the polished surface of the gallium oxide single crystal wafer is bonded to the polished surface of the heterogeneous substrate according to an embodiment of the present disclosure.

Next, as shown in FIG. 4, the polished surface 100a of the gallium oxide single crystal wafer is bonded to the polished surface 200a of the heterogeneous substrate.

In an embodiment, a method for bonding the polished surface 100a of the gallium oxide single crystal wafer to the polished surface 200a of the heterogeneous substrate comprises one of surface-activated bonding, metal bonding and anodic bonding. When the surface-activated bonding is adopted, the surface-activated bonding is performed at a vacuum level of $1\times10^{-7}$ Pa, under a stress of 16 MPa, and at a temperature of 25° C. In this embodiment, the surface activated bonding is preferred, but the present disclosure is not limited herein.

Figure 5:
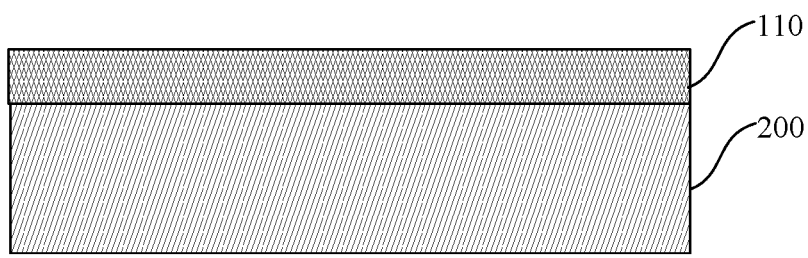
FIG. 5 is a schematic structural diagram of a composite structure formed after the structure in FIG. 4 is thinned according to an embodiment of the present disclosure.

Next, as shown in FIG. 5, the gallium oxide single crystal wafer 100 is thinned to obtain a composite structure comprising the heterogeneous substrate 200 and a gallium oxide layer 110 stacked in sequence.

In an embodiment, a method for thinning the gallium oxide single crystal wafer comprises grinding or wet etching. when the grinding is adopted to thin the gallium oxide single crystal wafer, the grinding is performed at a gear speed of 1500 rpm to 3000 rpm, for example, 1800 rpm, 2000 rpm, or 2500 rpm, a rotational speed of a workbench of 30 rpm to 120 rpm, for example, 60 rpm, 80 rpm, or 100 rpm, a feed speed of 5 μm/min to 30 μm/min, for example, 10 μm/min, 15 μm/min, or 25 μm/min, and a grinding time of 30 s to 100 min, for example, 1 min, 10 min, or 60 min. Grinding is preferred in this embodiment, and the grinding device is an OKAMOTO 200 thinning machine. However, the thinning method and the grinding device are not limited herein, and may be selected as desired. A gallium oxide layer 110 is obtained after the gallium oxide single crystal wafer is thinned, and the thickness of the gallium oxide layer 110 is in the order of microns.

Figure 6:
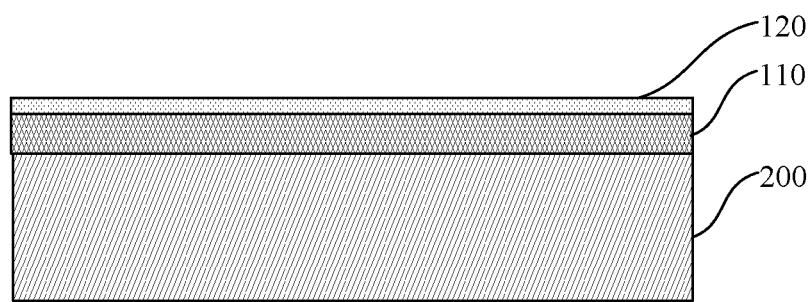
FIG. 6 is a schematic structural diagram of a gallium oxide semiconductor structure formed after the composite structure in FIG. 5 is treated and ion implanted according to an embodiment of the present disclosure.

Next, as shown in FIG. 6, a heavily doped gallium oxide layer 120 is formed on the top surface of the gallium oxide layer 110 by treating a top surface of the gallium oxide layer and performing an ion implantation on the gallium oxide layer, thereby obtaining the gallium oxide semiconductor structure comprising the heterogeneous substrate 200, the gallium oxide layer 110 and the heavily doped gallium oxide layer 120 stacked in sequence. Where the top surface of the gallium oxide layer is facing away from the polished surface of the heterogeneous substrate.

In an embodiment, a method for treating a top surface of the gallium oxide layer comprises one of chemical mechanical polishing, plasma etching, ion sputtering and chemical etching. The high-quality gallium oxide layer 110 may be acquired through above methods, which facilitates obtaining the heavily doped gallium oxide layer 120 with high-quality through the ion implantation. The ion implantation comprises one of Si ion implantation, Ge ion implantation, Sn ion implantation, and Nb ion implantation. When Si ion implantation is adopted, the Si ion implantation takes place at an energy level of 10 Kev to 80 Kev, for example, 25 Kev, 50 Kev, or 60 Kev, and at a dose of $1\times10^{15}$ ions/cm$^2$ to $5\times10^{16}$ ions/cm$^2$, for example, $1\times10^{16}$ ions/cm$^2$, or $2\times10^{16}$ ions/cm$^2$. When Ge ion implantation is adopted, the Ge ion implantation takes place at an energy level of 20 Kev to 170 Kev, for example, 50 Kev, 100 Kev, or 150 Kev, and at a dose of $1\times10^{15}$ ions/cm$^2$ to $5\times10^{16}$ ions/cm$^2$, for example, $1\times10^{16}$ ions/cm$^2$, or $2\times10^{16}$ ions/cm$^2$. When Sn ion implantation is adopted, the Sn ion implantation takes place at an energy level of 30 Kev to 275 Kev, for example, 60 Kev, 100 Kev, or 200 Kev, and at a dose of $1\times10^{15}$ ions/cm$^2$ to $5\times10^{16}$ ions/cm$^2$, for example, $1\times10^{16}$ ions/cm$^2$ or $2\times10^{16}$ ions/cm$^2$. When Nb ion implantation is adopted, the Nb ion implantation takes place at an energy level of 25 Kev to 225 Kev, for example, 50 Kev, 150 Kev, or 200 Kev, and at a dose of $1\times10^{15}$ ions/cm$^2$ to $5\times10^{16}$ ions/cm$^2$, for example $1\times10^{16}$ ions/cm$^2$, or $2\times10^{16}$ ions/cm$^2$. The ion implantation determines the carrier concentration of the heavily doped gallium oxide layer 120. Wherein the carrier concentration of the heavily doped gallium oxide layer 120 is greater than $1\times10^{19}$/cm$^3$. The depth of the ion implantation is in a range of 10 nm to 60 nm, that is, the heavily doped gallium oxide layer 120 is formed to have a thickness of 10 nm to 60 nm, such as 20 nm, 40 nm, 50 nm, or the like. As a result, the gallium oxide semiconductor structure is obtained. In this embodiment, the gallium oxide layer 110 is a thicker intermediate layer, and the carrier concentration of the gallium oxide layer 110 is lower than that of the heavily doped gallium oxide layer 120, which may increase the breakdown voltage of a subsequently prepared device. The highly thermally conductive heterogeneous substrate 200 improves the heat dissipation capacity of the device.

As shown in FIG. 6, an embodiment of the present disclosure also provides a gallium oxide semiconductor structure. The gallium oxide semiconductor structure can be prepared by the above-mentioned method for preparing a gallium oxide semiconductor structure; however, the present disclosure is not limited herein. The material and structure of the gallium oxide semiconductor structure will not be repeated here. The gallium oxide semiconductor structure comprises a heterogeneous substrate 200, a gallium oxide layer 110 and a heavily doped gallium oxide layer 120 stacked in sequence.

For example, the carrier concentration of the gallium oxide layer 110 is lower than that of the heavily doped gallium oxide layer 120. Wherein the carrier concentration of the gallium oxide layer 110 is in a range of $1\times10^{16}$/cm$^3$ to $9\times10^{17}$/cm$^3$, e.g., $6\times10^{16}$/cm$^3$, or $6\times10^{17}$/cm$^3$, and the carrier concentration of the heavily doped gallium oxide layer 120 is greater than $1\times10^{19}$/cm$^3$.

For example, the thickness of the gallium oxide layer 110 is in a range of 5 μm and 100 μm, e.g., 10 μm, 25 μm, 50 μm, 75 μm, or the like, and the thickness of the heavily doped gallium oxide layer 120 is in a range of 10 nm and 60 nm, e.g., 20 nm, 40 nm, 50 nm, or the like.

For example, the heterogeneous substrate 200 comprises one of a silicon carbide substrate, a diamond substrate, an aluminum nitride substrate, and a silicon substrate, and the carrier concentration of the heterogeneous substrate is greater than $1\times10^{18}$/cm$^3$.

An embodiment of the present disclosure also provides a method for preparing a vertical gallium oxide-based power device, which comprises preparing the vertical gallium oxide-based power device by using the method for preparing a gallium oxide semiconductor structure as described above. Details may be made reference to following embodiments, which will not be described here.

In an embodiment, the vertical gallium oxide-based power device prepared on the basis of the gallium oxide semiconductor structure is provided. In the vertical gallium oxide-based power device, the gallium oxide layer is a thicker intermediate layer, the carrier concentration of the gallium oxide layer is lower than that of the heavily doped gallium oxide layer, and a breakdown voltage of the vertical gallium oxide-based power device is also increased through structural design. In addition, the highly thermally conductive heterogeneous substrate improves the heat dissipation capacity of the vertical gallium oxide-based power device. Therefore, above characteristics are extremely important for the development of vertical gallium oxide-based high-power devices in the future.

An embodiment of the present disclosure also provides a vertical gallium oxide-based power device, which comprises a gallium oxide semiconductor structure as described above.

Figure 9:
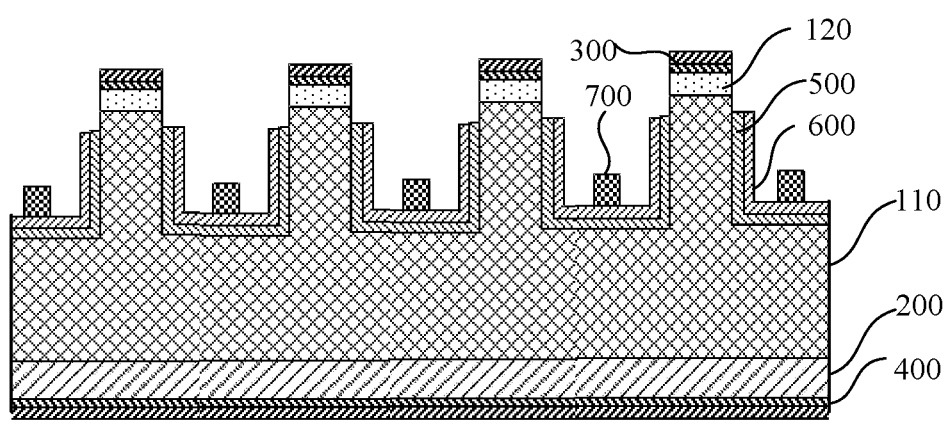
FIG. 9 is a schematic structural diagram of a vertical gallium oxide-based power device according to an embodiment of the present disclosure.

In an embodiment, as shown in FIG. 9, the vertical gallium oxide-based power device comprises the gallium oxide semiconductor structure, a drain electrode 400, a source electrode 300, a gate oxide layer 500, a gate electrode 600, and a gate contact 700. Where the gallium oxide semiconductor structure includes the heterogeneous substrate 200, the gallium oxide layer 110 and the heavily doped gallium oxide layer 120 stacked in sequence. The drain electrode 400 is in contact with the heterogeneous substrate 200. The source electrode 300 is located on the heavily doped gallium oxide layer 120. The gate oxide layer 500 and a gate electrode 600 are stacked in sequence and located on the gallium oxide layer 110. And the gate contact 700 is located on the gate electrode 600.

Figure 7:
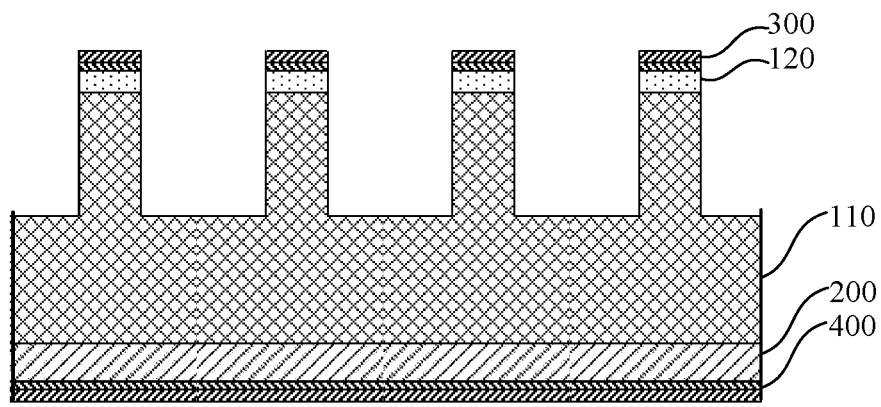
FIG. 7 is a schematic structural diagram of a source electrode and a drain electrode formed in the preparation of a vertical gallium oxide-based power device according to an embodiment of the present disclosure.
Figure 8:
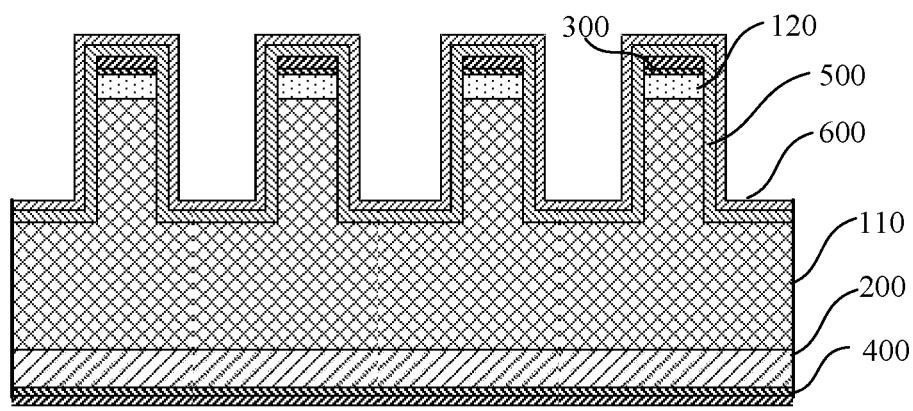
FIG. 8 is a schematic structural diagram of a gate electrode formed in the preparation of a vertical gallium oxide-based power device according to an embodiment of the present disclosure.

FIGS. 7-9 are schematic structural diagrams of structures formed in each step of preparing a vertical gallium oxide-based power device on the basis of the gallium oxide semiconductor structure.

In an embodiment, FIG. 7 is a schematic structural diagram of a source electrode 300 and a drain electrode 400 formed in the preparation of a vertical gallium oxide-based power device according to an embodiment of the present disclosure. In FIG. 7, a Fin is formed after the heavily doped gallium oxide layer 120 and the gallium oxide layer 110 are etched, the source electrode 300 is formed on the heavily doped gallium oxide layer 120 and the drain electrode 400 is formed on the surface of the heterogeneous substrate 200. The number of the Fin is preferably greater than 4. the present disclosure is described by taking 4 fins as an example, however, the present disclosure is not limited herein. The device with multiple Fins further provides a large amount of current. The source electrode 300 or the drain electrode 400 may be an Au/Ti electrode; however, the present disclosure is not limited herein. The method for preparing the source electrode 300 or the drain electrode 400 is not limited herein. FIG. 8 is a schematic structural diagram of a gate electrode formed in the preparation of a vertical gallium oxide-based power device according to an embodiment of the present disclosure. In FIG. 8, the gate oxide layer 500 and the gate electrode 600 are prepared on the basis of the structure formed in FIG. 7. The gate oxide layer 500 may be made of alumina, silica, or the like, and the gate electrode 600 may be a Pt/Ti electrode or a Pt electrode, etc. FIG. 9 is a schematic structural diagram of a vertical gallium oxide-based power device according to an embodiment of the present disclosure. In FIG. 9, the source electrode 300 is exposed by etching, a gate contact 700 is formed on the gate electrode 600, then the vertical gallium oxide-based power device is prepared.

The present disclosure is further described in conjunction with specific embodiments.

A β-type unintentionally doped gallium oxide single crystal wafer having a polished surface, a size of 2 inches, a surface orientation of (−201), and a thickness of 680 μm, and a silicon carbide substrate having a polished surface, a size of 4 inches, a surface orientation of (0001), and a thickness of 350 μm are provided. The polished surface of the gallium oxide single crystal wafer is bonded to the polished surface of the silicon carbide substrate to form a bonded sheet. The gallium oxide single crystal wafer on the bonded sheet was ground and chemically polished, to obtain a gallium oxide layer with a thickness of 50 μm on the silicon carbide substrate. Si ion implantation is performed on the gallium oxide layer to form a heavily doped gallium oxide layer with a thickness of 40 nm. Wherein Si ion implantation is performed at an energy level of 20 Kev, a dose of $2\times10^{16}$ ions/cm$^2$, and a temperature of 20° C. Accordingly, a gallium oxide semiconductor structure on a highly doped, highly thermally conductive heterogeneous substrate is formed.

A vertical gallium oxide-based power device is prepared on the basis of the gallium oxide semiconductor structure on a highly doped, highly thermally conductive heterogeneous substrate through the following process:

A hard mask is formed after the metal chromium (Cr) with a thickness of 150 nm is exposure to electron beam or by thermal evaporation.

Next, the hard disk is etched by using inductive coupled plasma (ICP), to form a Fin with a height of 1.5 μm and a width of 400 nm. Wherein an etching time is 15 min, and an etching gas is BcI$_3$/Cl$_2$/Ar. The number of the Fin is preferably greater than 4. The present disclosure takes 4 Fins as an example; however, the present disclosure is not limited herein. Referring to FIG. 7.

The remaining chromium is then removed by using a chromium removing agent, and then metal deposition is performed on the Fin to form a source electrode. Wherein the source electrode is an Au/Ti electrode, the thickness of metal Ti is 20 nm, and the thickness of metal Au is 100 nm. A drain electrode is formed on a bottom surface of the silicon carbide substrate. The preparation method and material of the drain electrode are similar to those of the source electrode. A step of thinning the silicon carbide substrate may be performed before the drain electrode is formed.

Next, a 20 nm-thick gate oxide layer and a 50 nm-thick gate electrode are formed on the Fin by using atomic layer deposition process (ALD), as shown in FIG. 8. Wherein the material of the gate oxide layer is alumina (Al$_2$O$_3$), and the material of the gate electrode is metal Pt.

Finally, the gate electrode and the gate oxide layer on the Fin are partially removed, to expose the source electrode, and the gate contact is prepared by using electron beam lithography system (EBL), as shown in FIG. 9. In this way, the preparation of the vertical gallium oxide-based power device is completed.

As described above, the present disclosure provides the gallium oxide semiconductor structure, the vertical gallium oxide-based power device and the preparation method. An unintentionally doped gallium oxide layer is transferred to a highly doped and highly thermally conductive heterogeneous substrate by bonding and thinning. Then a heavily doped gallium oxide layer is formed on the gallium oxide layer by treating and ion implantation, thereby preparing the gallium oxide semiconductor structure comprising the heterogeneous substrate, the gallium oxide layer, and the heavily doped gallium oxide layer stacked in sequence. Consequently, the present disclosure solves the problem of poor thermal conductivity of a gallium oxide thin film prepared by using a homo-epitaxial method, and the problem of difficulty in growing a high-quality gallium oxide thin film due to lattice mismatch when the gallium oxide thin film is prepared by using an epitaxial method on a heterogeneous substrate. In a vertical gallium oxide-based power device prepared on the basis of the gallium oxide semiconductor structure, the gallium oxide layer is a thicker intermediate layer and a carrier concentration of the gallium oxide layer is less than that of the heavily doped gallium oxide layer. In addition, the breakdown voltage of the device is also increased through structural design. The highly thermally conductive heterogeneous substrate improves the heat dissipation performance of the device. The device with multiple Fin structures provides a large amount of current. The present disclosure is of great significance for the development of vertical gallium oxide-based high-power devices in the future. Thus, the present disclosure effectively overcomes various shortcomings in the prior art and has high industrial application value.

The above embodiments are merely illustrative of the principles and advantages of the present disclosure, and not intended to limit the present disclosure. Modifications or variations can be made to the above embodiments by those skilled in the art without departing from the spirit and scope of the present disclosure. Therefore, all equivalent modifications or changes made by those skilled in the art without departing from the spirit and scope of the present disclosure are covered by the appended claims of the present disclosure.

What is claimed is:

1. A method for preparing a gallium oxide semiconductor structure, comprising the following steps:
   providing a gallium oxide single crystal wafer, wherein a surface of the gallium oxide single crystal wafer is a polished surface;
   providing a heterogeneous substrate, wherein a surface of the heterogeneous substrate is a polished surface;
   bonding the polished surface of the gallium oxide single crystal wafer to the polished surface of the heterogeneous substrate;
   thinning the gallium oxide single crystal wafer to obtain a gallium oxide layer and obtain a composite structure comprising the heterogeneous substrate and the gallium oxide layer stacked in sequence;
   treating a top surface of the gallium oxide layer, wherein the top surface of the gallium oxide layer is facing away from the polished surface of the heterogeneous substrate; and
   forming a heavily doped gallium oxide layer on the top surface of the gallium oxide layer by performing an ion implantation on the gallium oxide layer, thereby obtaining the gallium oxide semiconductor structure comprising the heterogeneous substrate, the gallium oxide layer, and the heavily doped gallium oxide layer stacked in sequence;

wherein a carrier concentration of the gallium oxide layer is lower than that of the heavily doped gallium oxide layer, wherein the carrier concentration of the gallium oxide layer is in a range of $1\times10^{16}/cm^3$ to $9\times10^{17}/cm^3$, and the carrier concentration of the heavily doped gallium oxide layer is greater than $1\times10^{19}/cm^3$.

2. The method for preparing the gallium oxide semiconductor structure according to claim 1, wherein the heterogeneous substrate comprises one of a silicon carbide substrate, a diamond substrate, an aluminum nitride substrate, and a silicon substrate.

3. The method for preparing the gallium oxide semiconductor structure according to claim 1, wherein a carrier concentration of the heterogeneous substrate is greater than $1\times10^{18}/cm^3$.

4. The method for preparing the gallium oxide semiconductor structure according to claim 1, wherein a method for bonding the polished surface of the gallium oxide single crystal wafer to the polished surface of the heterogeneous substrate comprises surface-activated bonding, and the surface-activated bonding is performed at a vacuum level of $1\times10^{-7}$ Pa, under a stress of 16 MPa, at a temperature of 25° C.

5. The method for preparing the gallium oxide semiconductor structure according to claim 1, wherein a method for thinning the gallium oxide single crystal wafer comprises grinding or wet etching.

6. The method for preparing the gallium oxide semiconductor structure according to claim 5, wherein when the grinding is adopted to thin the gallium oxide single crystal wafer, the grinding is performed at a gear speed of 1500 rpm to 3000 rpm, a rotational speed of a workbench of 30 rpm to 120 rpm, a feed speed of 5 μm/min to 30 μm/min, and a grinding time of 30 s to 100 min.

7. The method for preparing the gallium oxide semiconductor structure according to claim 1, wherein a method for treating the top surface of the gallium oxide layer comprises one of chemical mechanical polishing, plasma etching, ion sputtering and chemical etching.

8. The method for preparing the gallium oxide semiconductor structure according to claim 1, wherein the ion implantation comprises one of Si ion implantation, Ge ion implantation, Sn ion implantation and Nb ion implantation.

9. The method for preparing the gallium oxide semiconductor structure according to claim 8, wherein the Si ion implantation takes place at an energy level of 10 Kev to 80 Kev and at a dose of $1\times10^{15}$ ions/cm² to $5\times10^{16}$ ions/cm²; the Ge ion implantation takes place at an energy level of 20 Kev to 170 Kev and at a dose of $1\times10^{15}$ ions/cm² to $5\times10^{16}$ ions/cm²; the Sn ion implantation takes place at an energy level of 30 Kev to 275 Kev and at a dose of $1\times10^{15}$ ions/cm² to $5\times10^{16}$ ions/cm²; and the Nb ion implantation takes place at an energy level of 25 Kev to 225 Kev and at a dose of $1\times10^{15}$ ions/cm² to $5\times10^{16}$ ions/cm².

10. The method for preparing the gallium oxide semiconductor structure according to claim 1, wherein a depth of the ion implantation is in a range of 10 nm to 60 nm.

11. The method for preparing the gallium oxide semiconductor structure according to claim 1, wherein a surface roughness of the polished surface of the gallium oxide single crystal wafer is less than 1 nm, and a surface roughness of the polished surface of the heterogeneous substrate is less than 1 nm.

12. A method for preparing the vertical gallium oxide-based power device, comprising preparing the vertical gallium oxide-based power device by using the method for preparing the gallium oxide semiconductor structure according to claim 1.

13. The method for preparing the gallium oxide semiconductor structure according to claim 1, wherein the gallium oxide single crystal wafer is an unintentionally doped gallium oxide single crystal wafer.

14. The method for preparing the gallium oxide semiconductor structure according to claim 13, wherein the gallium oxide single crystal wafer is an α-type gallium oxide single crystal wafer or a β-type gallium oxide single crystal wafer.

* * * * *